United States Patent [19]

DaMocogno et al.

[11] 4,410,863
[45] Oct. 18, 1983

[54] SINGLE SIDEBAND GENERATOR WITH LEAKAGE SIGNAL CANCELLATION

[75] Inventors: Ninalbo G. DaMocogno, Winchester; Donald A. Siok, Westford; Denis L. Bourassa, Methuen; William R. Connerney, Needham, all of Mass.

[73] Assignee: The United States of America as represented by the Secretary of the Army, Washington, D.C.

[21] Appl. No.: 246,499

[22] Filed: Mar. 23, 1981

[51] Int. Cl.³ .............................................. H03C 1/06
[52] U.S. Cl. .................................... 332/37 R; 332/45; 455/63; 455/109
[58] Field of Search ................... 332/18, 37 R, 45, 44; 455/47, 63, 109, 46

[56] References Cited

U.S. PATENT DOCUMENTS 4,243,955  1/1981  Daniel et al. .................... 455/109 X Primary Examiner—Siegfried H. Grimm
Attorney, Agent, or Firm—Robert P. Gibson; Anthony T. Lane; Robert C. Sims

[57] ABSTRACT

Suppressing the L.O. leakage signal in the second converter section of a single sideband generator by utilization of a generator bypass circuit which supplies a signal at the generator output which in turn cancels the leakage L.O. signal.

5 Claims, 3 Drawing Figures

SINGLE SIDEBAND GENERATOR WITH LEAKAGE SIGNAL CANCELLATION

DEDICATORY CLAUSE

The invention described herein was made in the course of or under a contract or subcontract thereunder with the Government and may be manufactured, used, and licensed by or for the Government for governmental purposes without the payment to use of any royalties thereon.

BRIEF DESCRIPTIONS OF THE DRAWINGS

DESCRIPTION OF THE BEST MODE AND PREFERRED EMBODIMENTS

Figure 1:
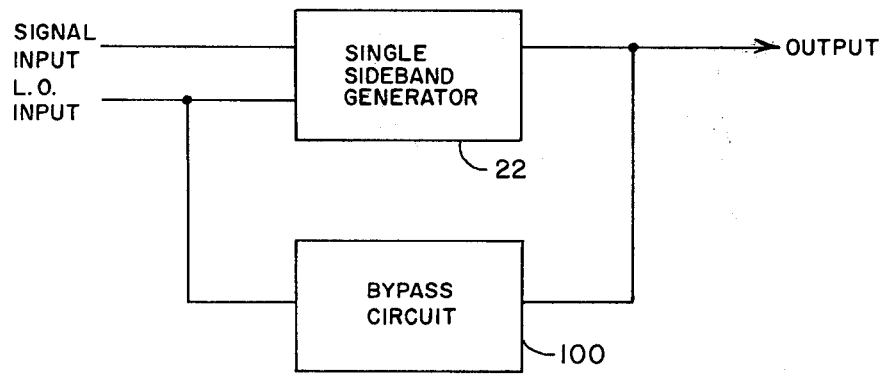
FIG. 1 is a block diagram illustrating the basic principle of the present invention.

One of the more serious design problems in microwave single sideband generators (S.S.B.G.) is that of satisfactorily suppressing the unwanted local oscillator (L.O.) leakage signal in the second converter section over even moderate frequency bandwidths, L.O. power variations and temperature extremes. FIG. 1 shows a block diagram of the basic arrangement. This invention disclosure solves this problem by utilizing a generator bypass circuit 100. The purpose of this circuit is to supply a L.O. signal to the generator 22 at the generator output which cancels the leakage L.O. signal.

The undesired leakage signal results from a combination of phase and amplitude assymmetries in diode reflection properties and hybrid leakage. Since the lines within the generator are used to phase out the "other sideband signals", no phase control is available to reduce the L.O. leakage. The magnitude of L.O. signal used to bias the diodes must be extremely high relative to the IF or UHF signal for reasons of intermodulation products and compression performance; therefore, even small diode reflection assymmetries and hybrid leakage result in a L.O. leakage signal comparable to the desired output (i.e., $\simeq -5$ dB: measured data).

The bypass or cancellation circuitry 100 (FIG. 1) when considered as a "black" box, must exhibit similar insertion phase and amplitude properties to the generator itself. The absolute phase must be $\Delta 180°$ from the generator. The more similar these properties, the more effective the cancellation circuit.

This circuit can have many different forms. One configuration consists of two directional couplers, a length of transmission line and a phase adjustment circuit. The directional couplers are used to extract signal from the L.O. input line and to feed the bypass circuit signal to the generator output. The directional coupler values, the phase adjuster and the transmission line phase length are empirically set for optimization of performance over the desired frequency bandwidth, temperature and L.O. power ranges.

Figure 2:
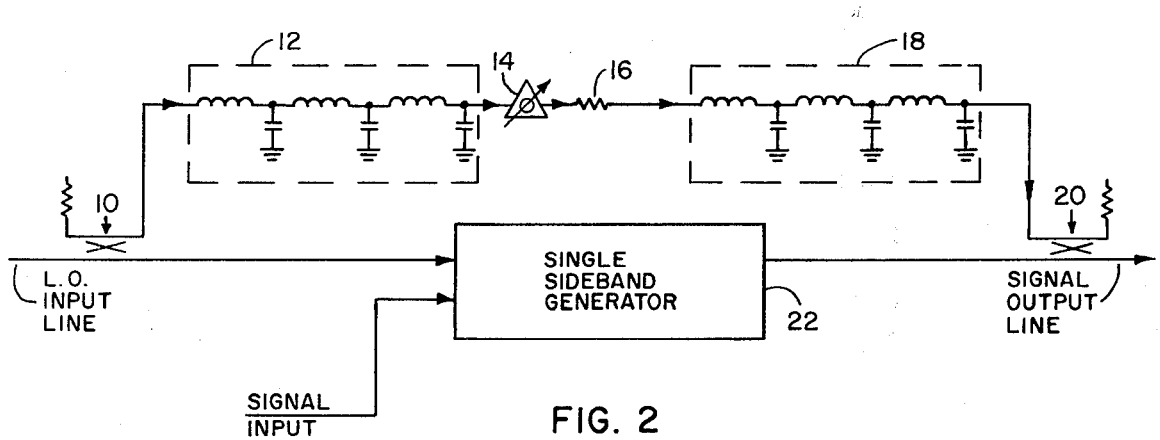
FIG. 2 is a schematic illustration of the first embodiment of the present invention.
Figure 3:
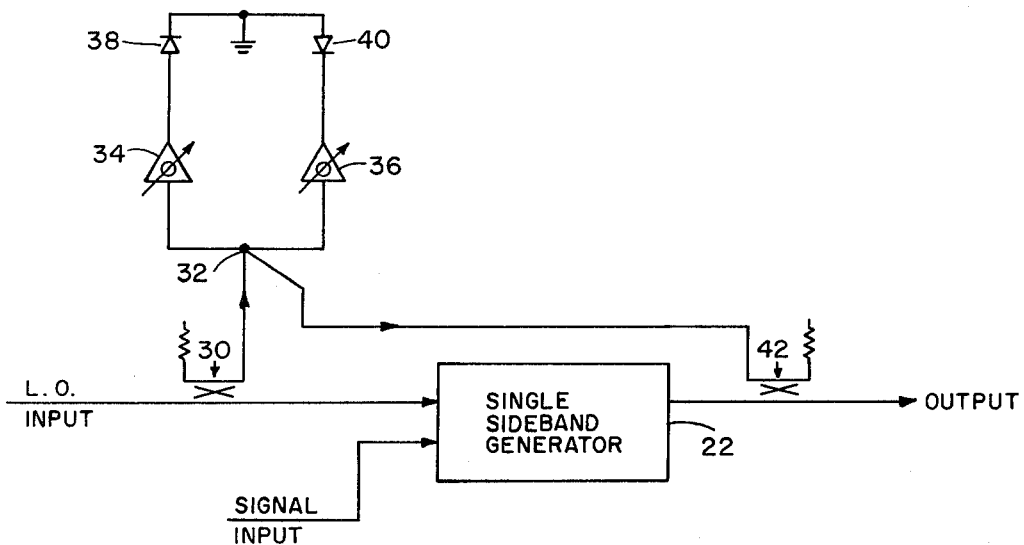
FIG. 3 is a schematic illustration of a second embodiment of the present invention.

FIGS. 2 and 3 show the inner conductor circuitry of different second converter sections of a single sideband generator. The bypass circuit in FIG. 2 consists of the parts described above, while FIG. 3 has a more refined circuit for improved variation. The refinement includes a diode-hybrid circuit plus an amplitude as well as phase trimmer.

FIG. 2 is a schematic diagram of the first embodiment of the by-pass circuit. A directional coupler 10 is used to couple off a portion of the local oscillator (L.O.) input signal to the single sideband generator 22. Such coupled signal is passed via a transmission line section 12, a variable phase shifter 14, an attenuator 16, and a second length of transmission line 18 to a second directional coupler 20. The latter is provided to inject a properly phased and attenuated replica of the L.O. signal on the output line from the single sideband generator 22 where it is used to cancel the L.O. leakage signal from the latter. The transmission line sections 12 and 18 are provided to simulate the path length through the single sideband generator 22 thereby to obtain the optimum bandwidth from the by-pass circuit. The variable phase shifter 14, which is here a trombone stripline section, is provided to adjust the phase of the L.O. signal from the by-pass circuit to be 180° out of phase with the L.O. leakage signal out of the single sideband generator 22. The attenuator 16, which may be a stripline pill attenuator from EMC Technology, Inc., Philadelphia, Pa., is provided to control the magnitude of the L.O. signal from the by-pass circuit such that it is of equal magnitude to the L.O. leakage signal from the single sideband generator 22.

Illustrated in FIG. 3 is a schematic diagram of the alternate embodiment of the by-pass circuit. Here a directional coupler 30 is used to couple off a portion of the L.O. input signal and pass it to a so-called "Magic-Tee" hybrid 32. A first one of the output ports (arms) of the latter is shown to include a variable phase shifter 34 and a diode 38, while the remaining output port also contains a variable phase shifter 36 and a diode 40. The diodes 38, 40 are tied together to ground and here act as variable loads. Again, the variable phase shifters 34 and 36 may simply be trombone sections of stripline. It should be appreciated that by adjusting one of the phase shifters 34 or 36 relative to the other, one may control both the phase and the amplitude of the output signal from the "Magic-Tee" hybrid 32. The output signal from the latter is injected by a directional coupler 42 into the output arm of the single sideband generator 22 where, as before, it is used to cancel the L.O. leakage signal from that device. One advantage of the alternate by-pass circuit is that it offers L.O. leakage suppression over a wider bandwidth as a result of more similar tracking properties between the former and the single sideband generator 22.

The by-pass circuit of FIG. 3 contains a mixer with diodes 38 and 40 biased to the same level as the generator diodes. This feature offers L.O. suppression over a wider bandwidth than here-to-fore due to more similar tracking properties between generator and by-pass circuitry. All generator diodes can now be biased with at least 3 db more L.O. drive which means better I.M.P.'s. This is possible because diode phase changes due to increased L.O. occur in both by-pass and generator circuit. The producibility of the single sideband generator (S.S.B.G.) is improved since diode lot to lot changes affecting the generator circuitry leakage have an identical effect on the by-pass circuitry leakage, hence relative tracking properties between the two remain the same. The isolation phase and amplitude leakage signals of the mixer hybrid rings are compensated for by those of the by-pass hybrid. The phase trimmers can also be used to adjust by-pass circuit amplitude as well as phase.

This fact alone most certainly will improve device producibility.

We claim:

1. In a network having a main generator which has two inputs and an output, its output producing an output signal which is indicative of an input signal on one of its inputs mixed with a local oscillator frequency signal input connected to its other input; the improvement comprising a bypass circuit having an input connected to said local oscillator frequency signal input and an output connected to the output of said main generator; said main generator having an undesirable leakage signal due to the local oscillator frequency signal input; said bypass circuit generating a compensating signal output which is equal in magnitude and 180° out of phase with said undesirable leakage signal; said bypass circuit comprises: a first coupler connected to the local oscillator input; a phase adjustment circuit; a length of transmission line connected between said first coupler and said phase adjustment circuit; said line being selected of a length to simulate electrical travel through said main generator; and a second directional coupler connected between said phase adjustment circuit and the output of said main generator whereby said bypass circuit can be empirically set for generating a compensating signal output equal in amplitude and opposite in phase to said undesirable leakage signal.

2. In a network having a main generator which has two inputs and an output, its output producing an output signal which is indicative of an input signal on one of its inputs mixed with a local oscillator frequency signal input connected to its other input; the improvement comprising a bypass circuit having an input connected to said local oscillator frequency signal input and an output connected to the output of said main generator; said main generator having an undesirable leakage signal due to the local oscillator frequency signal input; said bypass circuit generating a compensating signal output which is equal in magnitude and 180° out of phase with said undesirable leakage signal; said bypass circuit comprises a Magic-Tee hybrid circuit for generating said compensating signal output; a first coupler connecting said local oscillator frequency input to said Magic-Tee; and a second coupler connecting said Magic-Tee to said main generator output.

3. A network as set forth in claim 2 wherein said Magic-Tee contains first and second phase shifters; first and second diodes; said first phase shifter and said first diode being connected in series and being connected in parallel with the series connection of said second phase shifter and said second diode; said main generator containing in its circuitries a pair of diodes which are identical to said first and second diodes and are selected from the same manufacturing lot.

4. A network as set forth in claim 3 wherein said phase shifters are adjustable relative to each other so that both the phase and the amplitude of the compensating signal output of the bypass circuit can be controlled.

5. A network as set forth in claim 3 or 4 wherein said first and second diodes are biased to the same level as the diodes contained in said main generator.

* * * * *